United States Patent
Machida et al.

(10) Patent No.: US 9,056,454 B2
(45) Date of Patent: Jun. 16, 2015

(54) ACTUATOR, METHOD OF MANUFACTURING THE ACTUATOR, AND LIQUID DROPLET EJECTING HEAD, LIQUID DROPLET EJECTING APPARATUS, AND IMAGE FORMING APPARATUS HAVING THE ACTUATOR

(71) Applicants: Osamu Machida, Kanagawa (JP); Akira Shimofuku, Kanagawa (JP); Atsushi Takeuchi, Kanagawa (JP)

(72) Inventors: Osamu Machida, Kanagawa (JP); Akira Shimofuku, Kanagawa (JP); Atsushi Takeuchi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/303,858

(22) Filed: Jun. 13, 2014

(65) Prior Publication Data

US 2014/0375728 A1 Dec. 25, 2014

(30) Foreign Application Priority Data

Jun. 19, 2013 (JP) .................................. 2013-128472
Mar. 3, 2014 (JP) .................................. 2014-040838

(51) Int. Cl.
 B41J 2/045 (2006.01)
 H01L 41/08 (2006.01)
 H01L 41/09 (2006.01)
 H01L 41/318 (2013.01)
 H01L 41/331 (2013.01)

(52) U.S. Cl.
 CPC ........ *B41J 2/045* (2013.01); *Y10T 29/42* (2015.01); *H01L 41/0805* (2013.01); *H01L 41/0973* (2013.01); *H01L 41/318* (2013.01); *H01L 41/331* (2013.01)

(58) Field of Classification Search
 USPC ................................................ 347/68–72
 See application file for complete search history.

(56) References Cited

U.S. PATENT DOCUMENTS

| | | | |
|---|---|---|---|
| 5,530,465 A | 6/1996 | Hasegawa et al. | |
| 7,221,075 B2 | 5/2007 | Nanataki et al. | |
| 7,364,275 B2 * | 4/2008 | Lim et al. | 347/70 |
| 7,713,348 B2 | 5/2010 | Kijima et al. | |

(Continued)

FOREIGN PATENT DOCUMENTS

| | | |
|---|---|---|
| JP | 2002-370353 | 12/2002 |
| JP | 3379106 | 2/2003 |

(Continued)

OTHER PUBLICATIONS

K.D.Budd et al., "Sol-Gel Processing of PbTiO3, PbZrO3, PZT, and PLZT Thin Films" Proceedings of the British Ceramic Society 36(1985), pp. 107-121.

(Continued)

*Primary Examiner* — Henok Legesse
(74) *Attorney, Agent, or Firm* — Cooper & Dunham LLP

(57) ABSTRACT

An actuator includes a base member and an electro-mechanical transducer element including a first electrode, an electro-mechanical transducer film, and a second electrode. Further, the base member includes a thin wall part having a concave shape, the electro-mechanical transducer film is formed in a manner such that a film thickness of the electro-mechanical transducer film is gradually reduced from a center part of the electro-mechanical transducer film to both end parts of the electro-mechanical transducer film in at least one direction crossing a film thickness direction of the electro-mechanical transducer film.

6 Claims, 9 Drawing Sheets

(56) References Cited

U.S. PATENT DOCUMENTS

| | | | |
|---|---|---|---|
| 8,425,026 | B2 | 4/2013 | Machida et al. |
| 8,614,607 | B2 | 12/2013 | Il et al. |
| 8,646,180 | B2 | 2/2014 | Akiyama et al. |
| 8,690,297 | B2 | 4/2014 | Ueda et al. |
| 8,713,768 | B2 | 5/2014 | Watanabe et al. |
| 8,727,509 | B2 | 5/2014 | Shimofuku et al. |
| 2004/0101980 | A1 | 5/2004 | Kurokawa et al. |
| 2012/0026249 | A1 | 2/2012 | Kihira et al. |
| 2012/0028075 | A1 | 2/2012 | Yagi et al. |
| 2012/0206544 | A1 | 8/2012 | Machida et al. |
| 2012/0276303 | A1 | 11/2012 | Watanabe et al. |
| 2013/0050346 | A1 | 2/2013 | Takeuchi et al. |
| 2013/0070028 | A1 | 3/2013 | Watanabe et al. |
| 2013/0162726 | A1 | 6/2013 | Mizukami et al. |
| 2013/0164436 | A1 | 6/2013 | Yagi et al. |
| 2013/0169713 | A1 | 7/2013 | Takeuchi et al. |
| 2013/0176364 | A1 | 7/2013 | Machida et al. |
| 2013/0194350 | A1 | 8/2013 | Watanabe et al. |
| 2014/0049582 | A1 | 2/2014 | Machida et al. |

FOREIGN PATENT DOCUMENTS

| | | |
|---|---|---|
| JP | 3379538 | 2/2003 |
| JP | 2003-297825 | 10/2003 |
| JP | 2003-309298 | 10/2003 |
| JP | 3473608 | 12/2003 |
| JP | 2006-176385 | 7/2006 |
| JP | 2009-196376 | 9/2009 |
| JP | 2011-146601 | 7/2011 |
| JP | 2012-064731 | 3/2012 |
| JP | 4963159 | 6/2012 |
| JP | 2012-199602 | 10/2012 |

OTHER PUBLICATIONS

A. Kumar et al., "Features of gold having micrometer to centimeter dimensions can be formed through a combination of stamping with an elastomeric stamp and an alkanethiol "ink" followed by chemical etching" Applied Physics Letters, 63, pp. 2002-2004 (1993).

* cited by examiner

ACTUATOR, METHOD OF MANUFACTURING THE ACTUATOR, AND LIQUID DROPLET EJECTING HEAD, LIQUID DROPLET EJECTING APPARATUS, AND IMAGE FORMING APPARATUS HAVING THE ACTUATOR

CROSS-REFERENCE TO RELATED APPLICATIONS

The present application is based on and claims the benefit of priority under 35 U.S.C §119 of Japanese Patent Application Nos. 2013-128472 filed on Jun. 19, 2013 and 2014-040838 filed on Mar. 3, 2014, the entire contents of which are hereby incorporated herein by reference.

BACKGROUND OF THE INVENTION

1. Field of the Invention

The present invention generally relates to an actuator including an electro-mechanical transducer film, a method of manufacturing the actuator, and a liquid droplet ejecting head, a liquid droplet ejecting apparatus, and an image forming apparatus having the actuator.

2. Description of the Related Art

An "electro-mechanical transducer element" including an electro-mechanical transducer film sandwiched between electrodes has been used in an inkjet recording apparatus as an image forming apparatus, etc. in related technologies. Due to various advantages such as very low sound (noise), fast print speed, higher ink flexibility, and capability of using a plain sheet, such an inkjet recording apparatus has been widely used as an image recording apparatus or an image forming apparatus such as a printer, a facsimile machine, a copier, etc.

A liquid droplet ejecting head used in the inkjet recording apparatus mainly includes nozzles ejecting ink droplets, a liquid chamber (a.k.a. e.g., an ejecting chamber, a pressurizing chamber, a pressure chamber, or an ink flow path) which is in communication with the nozzles, and a pressure generation means which generates a pressure in the liquid chamber. As such a pressure generation means, there has been known a piezo-type pressure generation means which ejects liquid droplets by deforming and displacing a vibration plate that is formed, as a part of a wall surface of the liquid chamber, by using an electro-mechanical transducer element such as a piezoelectric element.

The electro-mechanical transducer element used in the piezo-type pressure generation means includes a lower electrode (a first electrode), an electro-mechanical transducer layer, and an upper electrode (a second electrode), which are laminated to each other. In a case of a liquid droplet ejecting head including a plurality of the liquid chambers, the electro-mechanical transducer elements corresponding to the respective liquid chambers are disposed (provided).

As the electro-mechanical transducer layer of the electro-mechanical transducer element, lead zirconate titanate (PZT) ceramics or the like may be used. Such objects may generally be called a "metal composite oxide" due to the multiple metal oxides included as the main components.

Here, as a method of forming the electro-mechanical transducer film, there has been known a method of ejecting liquid droplets in which liquid droplets of an application liquid including a material for forming the electro-mechanical transducer film are ejected from nozzles so that the application liquid is applied onto a predetermined part on an electrode (see, for example, Japanese Laid-open Patent Publication Nos. 2003-297825 and 2006-176385).

Further, Japanese Laid-open Patent Publication No. 2011-146601 discloses a method of forming the electro-mechanical transducer film based on a sol-gel method in which two steps are repeated so as to obtain a desired film thickness, the two steps including a step of partially applying a sol-gel liquid, by an inkjet method, onto an electrode whose surface is partially modified and a step of sol-gel liquid drying, thermally decomposing, and crystallizing the partially applied sol-gel liquid.

Further, as for the liquid droplet ejecting head, there have been various proposals about the sizes of the liquid chamber and the electro-mechanical transducer element formed on the substrates included in an actuator.

For example, Japanese Laid-open Patent Publication No. 2002-370353 discloses the structure having the following sizes of a liquid injection head which includes nozzles ejecting ink droplets, a liquid chamber formed on a substrates and in communication with the nozzles, a vibration plate formed as a part of a wall surface of the liquid chamber, and a piezoelectric element (electro-mechanical transducer element).

Specifically, a relationship $Lu \leq Lp < Ll$ is satisfied where the symbols "Lu", "Lp", "Ll", and "L" denote the lengths in a chamber arranging direction of the upper electrode, the piezo-electric film, the symbol, the lower electrode, and the liquid chamber, respectively. By forming so as to satisfy the above relationship, it becomes possible to remove the problem regarding the manufacturing process, reduce the leak current between the upper and lower electrodes, reduce the sizes, and obtain higher density.

Further, another relationship $Lu < L$ is also satisfied. By doing this, it becomes possible to effectively deform the vibration plate and effectively inject liquid.

SUMMARY OF THE INVENTION

According to an aspect of the present invention, an actuator includes: a base member having a plate shape and an electro-mechanical transducer element formed on one surface side of the base member and including a first electrode, an electro-mechanical transducer film, and a second electrode.

Further, the base member includes a thin wall part formed on a side opposite to the one surface side where the electro-mechanical transducer element is formed and having a concave shape.

Further, the electro-mechanical transducer film is formed in a manner such that a film thickness of the electro-mechanical transducer film is gradually reduced from a center part of the electro-mechanical transducer film to both end parts of the electro-mechanical transducer film in at least one direction crossing a film thickness direction of the electro-mechanical transducer film.

Further, when "Wp" denotes a width in the at least one direction which crosses the film thickness direction of the electro-mechanical transducer film and where the film thickness of the electro-mechanical transducer film changes and "Wi" denotes a width of the thin wall part of the base member in the at least one direction where the film thickness of the electro-mechanical transducer film changes, a relationship $Wp \geq Wi$ is satisfied.

BRIEF DESCRIPTION OF THE DRAWINGS

Other objects, features, and advantages of the present invention will become more apparent from the following description when read in conjunction with the accompanying drawings, in which.

DETAILED DESCRIPTION OF THE PREFERRED EMBODIMENTS

Figure 1:
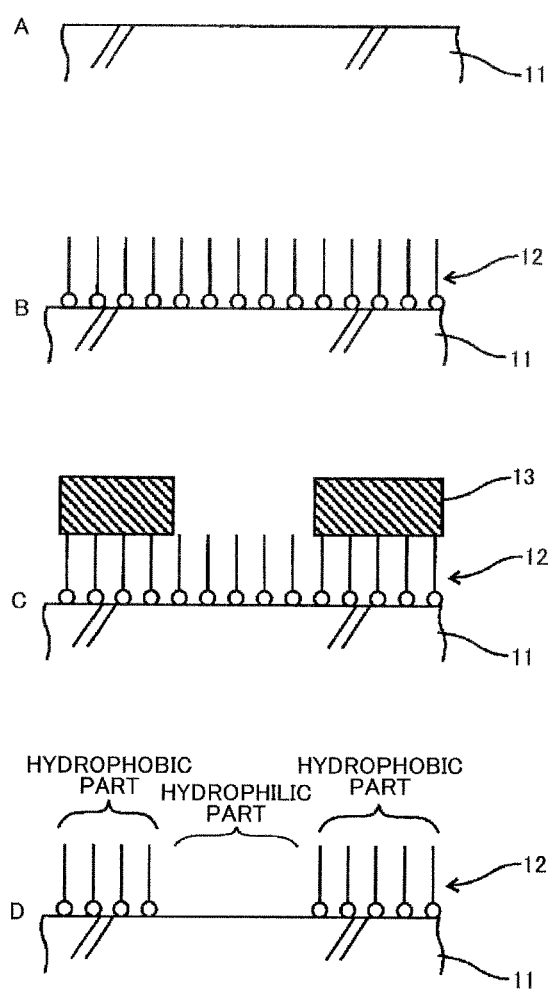
FIG. 1 illustrates some steps of a method of manufacturing an electro-mechanical transducer element including a step of forming an electro-mechanical transducer film according to an embodiment.

In related technologies, in an actuator including a substrate on which an electro-mechanical transducer element (piezoelectric element), a vibration plate, and a liquid chamber are formed in a conventional liquid droplet ejecting head, our inventors have found the following problem to be resolved through experiments, studies, and etc.

The problem in an actuator in related technologies is that the efficiency of the deformation relative to the applied voltage to the electro-mechanical transducer element (hereinafter "deformation efficiency") may be worse, so as to prevent the vibration plate from being effectively deformed and eventually reduce the drive efficiency of the actuator.

Basically, the actuator in related technologies herein refers to an actuator in which a base member, on which an electro-mechanical transducer element is formed, has a structure including a combination of the vibration plate and the substrate of the liquid chamber. However, the above-described problem may occur not only in an actuator having the above-described structure but also in an actuator having the following structure.

Namely, the above problem may occur when the actuator has a structure in which the base member, on which the electro-mechanical transducer element is formed, has a thin wall part which is formed in a concave shape from the surface opposite to the surface where the electro-mechanical transducer element is formed, so that the thin wall part is deformed by the electro-mechanical transducer element.

The present invention is made in light of the above problem, and may provide an actuator which has an enhanced deformation efficiency of the electro-mechanical transducer element and high drive efficiency, a method of manufacturing the actuator, and a liquid droplet ejecting head, a liquid droplet ejecting apparatus, and an image forming apparatus having the actuator.

According to an embodiment, it becomes possible to improve the deformation efficiency and increase the drive efficiency of the electro-mechanical transducer element.

In the following, embodiments of the present invention are described with reference to the accompanying drawings.

In the embodiments, an electro-mechanical transducer element including a lateral-vibration (bench mode) type electro-mechanical transducer film using the deformation of piezoelectric constant d31 is exemplarily described.

However, it should be noted that the present invention is not limited to this type of the electro-mechanical transducer film and may also be applied to other types of the electro-mechanical transducer films. Specifically, for example, the present invention may also be applied to a case where an electro-mechanical transducer film is formed by using an application liquid other than the sol-gel liquid described below.

Further, the present invention may also be applied to a case where a film other than an electro-mechanical transducer film is formed. For example, the present invention may also be applied to a film formed in a three-dimensional mold making technique using an ink jet technique.

In a case where the electro-mechanical transducer film is the PZT film, it is possible to use a PZT precursor solution which is synthesized from lead acetate trihydrate, isopropoxide titanium, and normal butoxide zirconium as the starting materials. The crystal water of lead acetate is dissolved in methoxy ethanol and then, dehydrated. A lead amount is adjusted to be 10 mol % excess relative to the stoichiometric composition.

The reason of this is to prevent the degradation of the crystalline due to evaporation of lead during a heating process. Isopropoxide titanium and normal butoxide zirconium are dissolved in methoxy ethanol, and an alcohol exchange reaction and an esterification reaction are processed, so as to uniformly mix with the methoxy ethanol solution where lead acetate is dissolved, to synthesize PZT precursor solution.

A PZT concentration of the PZT precursor solution is adjusted to, for example, 0.1 mol/litter. In the following description, the PZT precursor solution which is synthesized based on the method described above (hereinafter referred to as "PZT precursor solution A") is used.

Further, in the case where the electro-mechanical transducer film is the PZT film, for example, a liquid described in "K. D. Budd, S. K. Dey and D. A. Payne, Proc. Brit. Ceram. Soc. 36, 107 (1985)" may be used as the PZT precursor solution. Namely, the liquid may be obtained by dissolving lead acetate, zirconium alkoxide, and titanium alkoxide compound as the starting materials in methoxy ethanol as a common solvent so as to form a homogeneous solution.

The PZT precursor solution described above may also be called a "sol-gel liquid".

The PZT is a solid solution of lead zirconate ($PbZrO_3$) and lead titanate ($PbTiO_3$), and the properties of PZT vary depending of the ratio between lead zirconate ($PbZrO_3$) and lead titanate ($PbTiO_3$). Generally, a composition having an excellent piezoelectric property is based on a ratio between PbZrO$_3$ and PbTiO$_3$ of 53:47, that is expressed as "PbZr$_{0.53}$Ti$_{0.47}$O$_3$" in a chemical formula, and is generally referred to as "PZT(53/47)".

The staring materials of lead acetate, zirconium alkoxide, and titanium alkoxide compound are weighed based on the chemical formula. A metal alkoxide compound is easily hydrolyzed due to moisture in the air. Therefore, an appropriate amount of a stabilizing agent such as acetylacetone, acetic acid, or diethanolamine may be added to the precursor solution.

As an example of a composite oxide other than PZT, there is, for example, barium titanate. In this case, it is possible to prepare a barium titanate precursor solution by dissolving a barium alkoxide and a titanium alkoxide compound as the starting materials in a common solvent.

Further, in a case where a patterned PZT film is to be acquired as an electro-mechanical transducer film on a surface of a first electrode on a substrate which serves as a base, the PZT film is acquired as described below. Namely, the PZT film is acquired by forming a coated film by applying an application liquid of the above solution using a liquid droplet ejecting method and then performing a heating process, which includes a solvent drying process, a thermal decomposition process, and a crystallization process, on the formed coated film.

In this case, volume shrinkage may occur during a change from the coated film to the crystallized film. Therefore, in order to acquire a crack-free film, it is desired that the film thickness acquired in a single cycle of the process be less than or equal to 100 nm. Further, it is also desired that the concentration of the precursor be adjusted so as to be appropriate based on a relationship between a film forming area of the electro-mechanical transducer film and an application amount of the PZT precursor solution.

Further, when the electro-mechanical transducer film is used in an electro-mechanical transducer element of the liquid droplet ejecting apparatus, it is desired that the film thickness of the PZT film be in a range from 1 μm to 2 μm. To obtain the film thickness, the process is to be repeated.

Further, when the sol-gel method is used to form a patterned electro-mechanical transducer layer, the PZT precursor solution is applied so as to form a desired pattern based on wettability control of the substrate which serves as the base. This can be done based on a phenomenon in which alkanethiol is self-assembled (self-arranged) on a specific metal as described in "A Kumar and G. M. Whitesides, Appl. Phys. Left., 63, 2002(1993)".

More specifically, first, a thiol Self assembled monolayer (SAM) film is formed on a platinum-group metal surface of the substrate. The SAM film presents a hydrophobic property due to an alkyl group on the SAM film. The SAM film can be patterned by, for example, a known photolithographic etching using a photo resist. After the photo resist is peeled off (removed), the patterned SAM film remains. Therefore, the part of the remaining patterned SAM film presents hydrophobic property.

On the other hand, a platinum surface is exposed at a part where the SAM film is removed, so that the part presents a hydrophilic property. Therefore, by using the contrast of surface energy, it becomes possible to apply the PZT precursor solution in a desired pattern. In this embodiment, the SAM film is selectively formed on a region where no PZT precursor solution is applied.

Then, as described below in detail, the PZT precursor solution is selectively applied by a coating based on a liquid droplet ejecting method in which a consumption amount of the PZT precursor solution can be reduced (inkjet coating).

Here, it is assumed that the viscosity and the surface tension of the PZT precursor solution are adjusted so as to be applied using an inkjet head.

By applying the PZT precursor solution by the inkjet coating, a first-patterned PZT precursor coating film is formed. Then, the formed PZT precursor coating film is heated in accordance with a general sol-gel process. The process after the first process may be simplified due to the following reason.

The SAM film cannot be formed on an oxide thin film. Due to this, the SAM film is formed only on the platinum film exposed where no PZT film is formed by a first process. After a SAM process is performed on the sample having a first pattern, the PZT precursor solution is coated in a desired pattern using the inkjet method and a heat process is performed on the coated film of the PZT precursor solution.

Until the coated film has a desired thickness, the coating and heating processes are repeated. By using this method, it is possible to form the pattern film until the film thickness thereof is 5 μm. By applying the PZT precursor solution using the inkjet method, when compared with a conventional application method using a spin coater, it becomes possible to reduce the application amount (use amount) of the PZT precursor solution, and moreover, it becomes possible to greatly simplify the process.

In addition, the pattern formed by the inkjet method is in a liquid state after the application. Due to this, when the pattern is dried, the shape of the cross-section of the pattern is likely to become a cylindrical-type shape in which the middle part of the cross-section is convex and the film thickness is gradually reduced when separating from the middle part and approaching each of the ends of the cross-section as shown in, for example, FIG. 6 (hereinafter, the shape is simplified as a "cylindrical shape").

Figure 2:
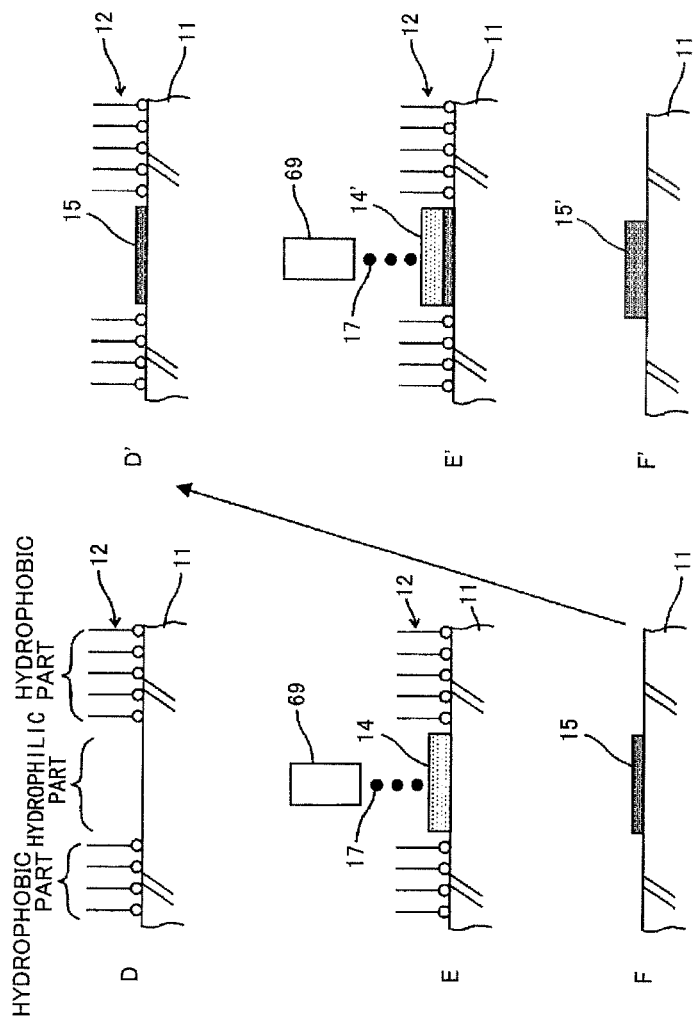
FIG. 2 illustrates other steps of the method of manufacturing the electro-mechanical transducer element according to the embodiment.

FIGS. 1 and 2 collectively illustrate a method of manufacturing the electro-mechanical transducer element including processes of forming an electro-mechanical transducer film according to an embodiment.

In process A of FIG. 1, a platinum electrode (not shown), which is made of a platinum group metal as a first electrode having excellent reactivity with thiol, is formed on a surface (upper surface) of a substrate 11 by a sputtering method.

In process B of FIG. 1, a SAM film 12 is formed on the surface of the platinum electrode of the substrate 11. The SAM film is acquired by dipping the substrate 11 into an alkanethiol solution (liquid) so that the SAM film can be self-assembled. In this example, an alkanethiol solution (liquid) is used which is prepared by dissolving alkanethiol molecules of CH$_3$(CH$_2$)—SH in a general organic solvent (e.g., alcohol, acetone, toluene, etc.) at a predetermined concentration (e.g., several mol/litter). The substrate 11 is dipped in the alkanethiol solution for a predetermined time period. Then, the substrate 11 is taken from the alkanethiol solution, and extra molecules are displacement washed with a solution to form the SAM film 12 on the surface of the platinum electrode.

Next, as shown in process C of FIG. 1, a pattern of a photoresist 13 is formed by photolithography.

Then, as shown in process D of FIG. 1, the SAM film 12 is removed by dry etching (e.g., irradiation of oxygen plasma or ultraviolet (UV) rays) and the photoresist 13 used for processing is removed, so as to finish the patterning of the SAM film 12. The SAM film 12 formed in this way has a contact angle relative to pure water of, for example, 92 degrees, so as to have a hydrophobic property. On the other hand, the surface of the platinum electrode of the substrate 11, which is exposed by removing the SAM film 12 formed thereon, has the contact angle relative to pure water of, for example, 54 degrees, so as to have a hydrophilic property.

Next, as shown in process E of FIG. 2, the PZT precursor solution is applied using a liquid droplet ejecting method in which PTZ precursor liquid droplets 17 are ejected from a nozzle of a liquid droplet ejecting head 69. The application of the PZT precursor solution is done so that a PZT film 14 is formed only on a hydrophilic part where the SAM film 12 is removed without forming the PZT film 14 on the SAM film 12 having a hydrophobic property.

After that, as shown in process F of FIG. 2, the heating processes including the solvent drying process, the thermal decomposition process, and the crystallization process, are performed to obtain an electro-mechanical transducer film 15.

Next, as shown in processes D' through F' of FIG. 2, the process of applying the PZT precursor solution using the liquid droplet ejecting method, and the processes of solvent drying, thermal decomposition, and crystallization of the applied PZT precursor solution are repeated in predetermined cycles (two or more cycles).

By doing this, it becomes possible to laminate multiple electro-mechanical transducer films, each of which alone has a thin film thickness, so as to obtain the electro-mechanical transducer film 15 having a predetermined film thickness.

By doing the processes D' through F', it becomes possible to reliably prevent the occurrence of a crack in the electro-mechanical transducer film 15 when compared with the case where the electro-mechanical transducer film 15 having the predetermined film thickness is formed within one cycle based on the processes D through F of FIG. 2.

In the method as illustrated in FIGS. 1 and 2, a case is described where the process of applying the PZT precursor solution using the liquid droplet ejecting method, and the processes of solvent drying, thermal decomposition, and crystallization of the applied PZT precursor solution are repeated in predetermined cycles. However, it should be noted that a manner of repeating the processes in the present invention is not limited to the manner as described with reference to FIGS. 1 and 2.

For example, a film forming process, which includes the process of applying the PZT precursor solution using the liquid droplet ejecting method and the processes of solvent drying and thermal decomposition, may be repeated "A" cycles (e.g., 3 cycles), and then the process of the crystallization may be performed on the film which has formed by the film forming process over "A" cycles.

After that, a set, which includes the film forming process repeated over "A" cycles and the process of the crystallization may be repeated over "B" cycles (e.g., 5 cycles), so as to form the electro-mechanical transducer film 15. In this case, the process of applying the PZT precursor solution is repeated "A×B" cycles (e.g., 3×5=15 cycles).

Further, for example, another film forming process, which includes the process of applying the PZT precursor solution using the liquid droplet ejecting method and the process of solvent drying, may be repeated "A'" cycles, and then, the processes of the thermal decomposition and the crystallization may be performed on the film which has formed by the film forming process over "A'" cycles.

After that, a set, which includes the other film forming process repeated over "A'" cycles and the processes of the thermal decomposition and the crystallization may be repeated over "B'" cycles, so as to form the electro-mechanical transducer film 15. In this case, the process of applying the PZT precursor solution is repeated "A'×B'" cycles.

Further, in the method of FIGS. 1 and 2, a case is described where a surface modification of forming a hydrophobic surface with the SAM film 12 is performed. Here, the SAM film 12 is formed on the surface other than a predetermined part ("application target region") where the PZT precursor solution is to be applied on the first electrode.

However, the surface modification may be done as described below. Namely, when a surface of the first electrode is a hydrophobic surface, the surface modification may be performed in a manner that the surface of the predetermined part ("application target region") where the PZT precursor solution is to be applied on the first electrode becomes a hydrophilic surface.

Figure 3:
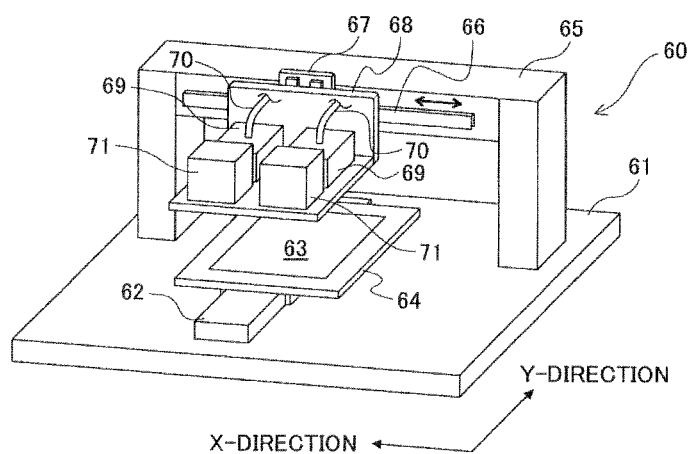
FIG. 3 is a perspective view of an example configuration of a liquid droplet ejecting application apparatus including a liquid droplet ejecting head in which the method of manufacturing an electro-mechanical transducer element can be used.

FIG. 3 is a perspective view schematically illustrating an example configuration of a liquid droplet ejecting application apparatus including a liquid droplet ejecting head having the above configuration. As shown in FIG. 3, in a liquid droplet ejecting application apparatus 60 having the liquid droplet ejecting head of FIG. 3, there is a Y-axis drive means 62 is mounted on a base plate 61. Further, on the Y-axis drive means 62, there is mounted a stage 64 on which a substrate 63 (corresponding to the substrate 11 in FIG. 1) is mounted.

The stage 64 is installed so as to be driven in the Y-axis direction. The stage 64 includes an adsorption means (not shown) based on vacuum or static electricity attached thereto so as to fix (determine) the position of the substrate 63. Further, there is an X-axis support member 65 mounted on the base plate 61. On the X-axis support member 65, there is mounted an X-axis drive means 66. Further, on the X-axis drive means 66, there is mounted a Z-axis drive means 67.

On the Z-axis drive means 67, there is mounted a head base 68 so as to be moved in the X-axis direction. On the head base 68, there are mounted two liquid droplet ejecting heads 69 having multiple nozzles to eject liquid. Further, there are supply pipes 70 connected to the respective liquid droplet ejecting heads 69 to supply liquid (PZT precursor solution) from a liquid tank (not shown) to the liquid droplet ejecting heads 69.

Further, in the liquid droplet ejecting application apparatus 60 of FIG. 3, as a film thickness measurement unit, there may be provided film thickness measurement devices (film thickness measurement camera) 71 near the respective liquid droplet ejecting heads 69 so as to measure the film thickness of the PZT film 14.

As the film thickness measurement device 71, for example, it may be possible to use a film thickness measurement device which irradiates white-color light onto the measurement target to measure the film thickness thereof based on a distance between interference patterns generated by the white-color light (e.g., Toray Engineering's FTM film thickness measurement device series). In this case, a result of the film thickness measurement by the film thickness measurement device 71 may be input to a controller (not shown) which controls the liquid droplet ejection by the liquid droplet ejecting heads 69, so as to control the ejection of the liquid droplets to obtain a desired film thickness.

Next, a specific example of a method of forming the PZT film is described which include a process of applying the PZT precursor solution by the liquid droplet ejecting application apparatus 60 including the liquid droplet ejecting heads 69 having the configuration described above.

In this embodiment, the surface modification process (i.e., processes B through D in FIG. 1), the application process (i.e., process E of FIG. 2), the drying process, and the thermal decomposition process are performed one time, so as to obtain the PZT film having (film thickness of) 90 nm and having a predetermined pattern formed on the platinum electrode on the substrate 11. Here, in the surface modification process, the SAM film 12 is partially formed by a dipping process to dip the substrate 11 in alkanethiol liquid.

Further, in the application process, the PZT precursor solution A is selectively applied using a liquid droplet ejecting application apparatus including the liquid droplet ejecting head having the configuration described above. Further, in the drying process, the film 14' of the applied PZT precursor solution A is dried at a predetermined temperature (120° C.), and in the thermal decomposition process, an organic substance in the film of the dried PZT precursor solution A is thermally decomposed at a predetermined temperature (500° C.).

Then, as the following processes, after the substrate 11 is washed with isopropyl alcohol, the substrate 11 is dipped in the dipping process as described above to form the SAM film. In the second cycle or later, the SAM film is not formed on an oxide film. Therefore, as shown in process D' of FIG. 2, the SAM film 12 is acquired without performing a lithography process. Further, the contact angle of the SAM film 12 relative to pure water was 92 degrees and the contact angle of the electro-mechanical transducer film 15 relative to pure water was 34 degrees.

In this state, the position is aligned to the position on the PZT film 14 formed in the first cycle, the film 14' of the PZT precursor solution A is applied again by the liquid droplet ejecting application apparatus as shown in process E' of FIG. 2. Further, the same heating process including the drying process, the thermal decomposition process as that in the first cycle is performed to form the electro-mechanical transducer film 15' as shown in process F' of FIG. 2. The film thickness of the electro-mechanical transducer film 15' was 180 nm.

Further, the process of the second layer (in the second cycle) including the surface modification process, the application process, the drying process (120° C.), and the thermal decomposition (500° C.) is repeated six times (six cycles) to obtain the electro-mechanical transducer film 15' having the film thickness of 540 nm. After that, in the crystallization process, the heating process as the rapid thermal anneal (RTA) process is done.

By doing this, a PZT film as the electro-mechanical transducer film patterned on the platinum electrode of the substrate 11 is formed. As a result, there was no failure such as a crack being detected in the formed PZT film.

Further, after that, the process including the surface modification process, the application process, the drying process (120° C.), and the thermal decomposition (500° C.) is repeated sixteen times (sixteen cycles) and the crystallization process is done. As a result, there was no failure such as a crack being detected in the formed PZT film and the film thickness thereof reached 2000 nm.

Figure 4:
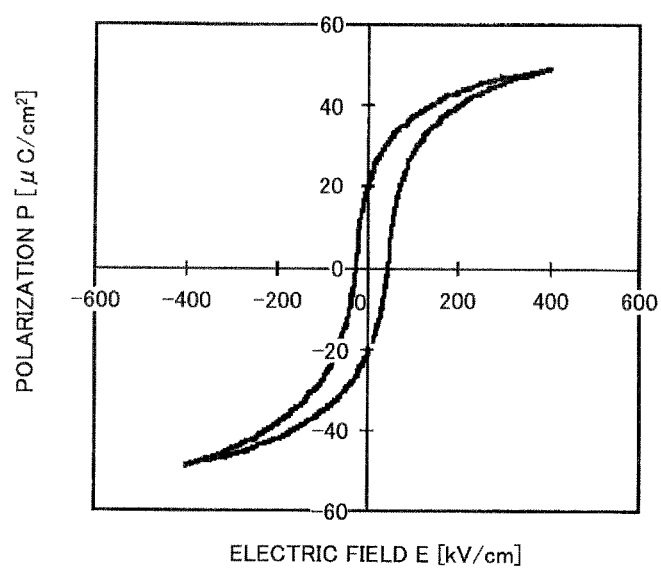
FIG. 4 is an example graph of a polarization and electric field intensity (P-E) hysteresis curve of a PZT film.

The upper electrode (second electrode) made of platinum is formed on the pattered PZT film by sputter deposition, and the electric properties and the electro-mechanical transducing capability (piezoelectric constant) of the PZT film were evaluated. As a result, the hysteresis curve between polarization (P) and electric field intensity (E) ("P-E hysteresis curve") as shown in FIG. 4 was obtained.

In the PZT film, a relative permittivity is 1220, a dielectric loss is 0.02, a residual polarization is 19.3 $\mu C/cm^2$, and a coercive electric field is 36.5 kV/cm. In this way, it is demonstrated that the PZT film has electrical properties similar to those of a general ceramic sintered body. Further, the property (piezoelectric constant) of the electro-mechanical transducer film was obtained by measuring the deformation amount due to electric field application using a laser Doppler vibrometer and calibrating based on simulation.

As a result, the piezoelectric constant d31 was 120 pm/V, which is also equivalent to the value in the ceramic sintered body. This characteristic value is supposed to be sufficient as the value in the piezoelectric element to be used in the liquid droplet ejecting head. The maximum applied voltage to the electro-mechanical transducer film during the measurement was 50 V.

Here, as the values of the pattern of the PZT film formed in this embodiment, the width of the cross-section surface orthogonal to the longitudinal direction of the pattern (hereinafter may be referred to as a "film cross section") (in other words, the length in the short length direction) is approximately 52 µm, the length in the longitudinal direction is approximately 1 mm, and the film thickness in the middle part in the short length direction (i.e., the maximum film thickness) is approximately 2000 nm.

Figure 5:
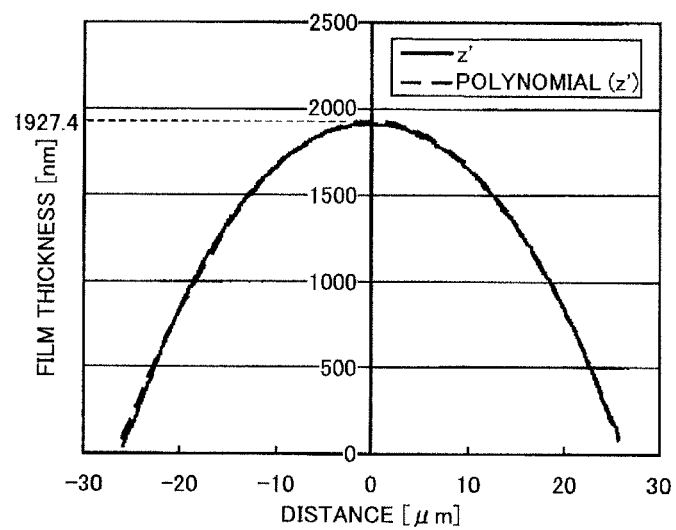
FIG. 5 is a graph of a measurement result of a film thickness, by using a surface roughness meter, of the PTZ film in the cross-sectional direction (short-length direction) formed by a repeated coating (application) of a PZT precursor solution A.

FIG. 5 is a graph illustrating a film thickness distribution in the short length direction in the film cross section of the PZT film formed by repeatedly applying the PZT precursor solution A in this embodiment as a result of a measurement using a surface roughness meter.

In the shape of the film thickness distribution, the film thickness is maximized at the center (middle) of the PZT film and is uniformly (gradually) reduced as the distance to the edge is reduced, so that the center (middle) part has a convex cylindrical shape. The maximum film thickness in the middle part in this example is approximately 2000 nm as described above.

In the graph of FIG. 5, the solid line denotes the measurement result when the film thickness distribution in the film cross section orthogonal to the longitudinal direction of the PZT film formed in this embodiment is measured using a surface roughness meter. Further, in the graph of FIG. 5, the dotted line denotes the curve which is obtained by approximating the film thickness distribution shape of the PZT film in this embodiment by using polynomial approximation.

As may be apparent from FIG. 5, the film thickness distribution shape of the PZT film in this embodiment has a convex shape protruded on the upper electrode (second electrode) side and sufficiently matches the approximation formula of a quadratic function which can be generally expressed as follows:

$$y=-ax^2+b \quad \text{(formula 1).}$$

More specifically, in this embodiment, when the symbol "x" denotes the position (distance) (µm) from the center (x=0) of the cross section of the PZT film (i.e., film cross section) in the direction orthogonal to the film thickness direction and the symbol "y" is the function of "x" and denotes the film thickness of the PZT film at the position of "x", the film thickness distribution shape of the PZT film in this embodiment has a convex shape which sufficiently matches the approximation formula of a quadratic function as follows:

$$y=-2.64x^2+1927.4.$$

To investigate the relationship between the coefficient "a" and the constant "b" in the above formula 1, (i.e., $y=-ax^2+b$), plural PZT films having different film thicknesses in the center part and different widths in the short length direction were formed, so that the approximation formula of a quadratic function is obtained by applying polynomial approximation to the shape of the plural PZT films. As a result of the investigation, in any of the formed PZT films, the coefficient "a" and the constant "b" satisfy the following relationships:

$$0.8 \times \{(2Tm)/W^2\} < a < 1.2 \times \{(2Tm)/W^2\}$$

$$0.8Tm < b < 1.2Tm$$

Where the symbol "Tm" denotes the film thickness (nm) at the center part in the short length direction of the PZT film and the symbol "W" denotes the width (nm) in the short length direction of the PZT film.

As described above, in at least one film cross section of a PZT film according to this embodiment, the film thickness distribution shape of the PZT film has a convex shape protruded on the upper electrode (second electrode) side and sufficiently approximates the function expressed as $y=-ax^2+b$. This means that the PZT film formed by the inkjet method is self-assembled to have the film thickness distribution shape that can be approximated by the quadratic function of the above formula 1.

By having the film thickness distribution shape approximated by the quadratic function of the above formula 1, it may become possible for the electro-mechanical transducer element (i.e., piezoelectric actuator) having the PZT film according to this embodiment to provide effective vibration and deformed displacement.

Figure 6:
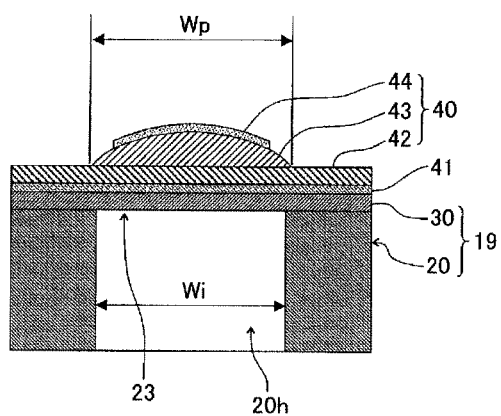
FIG. 6 is a cross-sectional view of an actuator manufactured for measuring a displacement amount of the PZT film according to an embodiment.

Next, a measurement of a displacement amount of the PZT film formed in this embodiment is described. FIG. 6 is a cross-sectional view of a piezoelectric actuator to measure the displacement amount of the PZT film according to this embodiment. As shown in FIG. 6, the piezoelectric actuator includes a base member 19, an adhesion layer 41, and an electro-mechanical transducer element 40 formed above the base member 19 via the adhesion layer 41. The base member 19 includes a silicon substrate 20, in which a through hole 20h is formed, and a vibration plate 30, so that a thin wall part 23 is formed due to the vibration plate 30 and the through hole 20h.

Further, the electro-mechanical transducer element 40 includes a lower electrode 42 as the first electrode, a PZT film 43 as the electro-mechanical transducer film, and an upper electrode 44 as the second electrode. Here, the through hole 20h of the silicon substrate 20 may be formed by etching either before or after the silicon substrate 20 is attached to the vibration plate 30.

Figure 7:
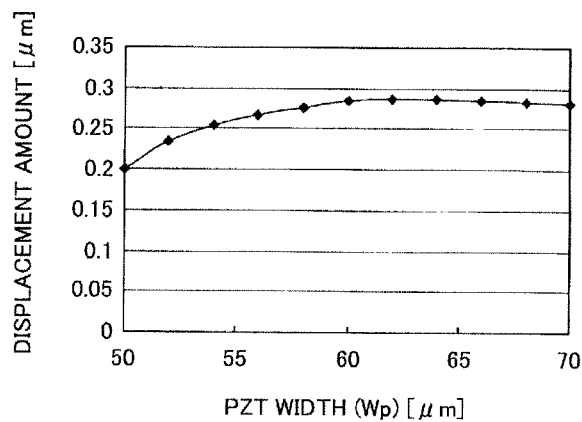
FIG. 7 is a graph illustrating an example comparison between the size of the PZT film in the short-length direction and the displaced amount in the actuator of FIG. 6.

FIG. 7 is a graph illustrating a change of the displacement amount of the PZT film 43 when "Wi" is set to constant and "Wp" is changed, where the "Wi" denotes the width in the direction crossing the film thickness direction of the PZT film 43 and in the film thickness change direction where the film thickness changes and the "Wp" denotes the width of the thin wall part 23 in the film thickness change direction. Specifically, the width "Wi" of the thin wall part 23 in the film thickness change direction of the PZT film 43 is formed (set) to 60 μm by etching.

As shown in the graph of FIG. 7, it is observed that the displacement amount of the PZT film 43 becomes greater when the width "Wp" in the film thickness change direction of the PZT film 43 is greater than or equal to 60 (μm) which is equivalent to the etching width "Wi" of the thin wall part 23 in the film thickness change direction. Namely, in the piezoelectric actuator according to this embodiment, it is preferable that the relationship Wp≥Wi be satisfied.

Since the edge parts of the thin wall part 23 are supported by the base member 19, the center part of the thin wall part 23 is more likely to be deformed than any other part of the thin wall part 23 and the deformation becomes more and more difficult as the distance to the (nearest) edge part is decreased. Further, the deformation amount of the PZT film 43 where the film is thicker is greater than the deformation amount of the PZT film 43 where the film is thinner. Therefore, by forming the PZT film 43 so as to have a cylindrical shape where the film thickness decreases as the distance to the (nearest) edge part is decreased, it becomes possible for the PZT film 43 to have a greater deformation amount in the center part of the thin wall part 23 and have a lesser deformation amount near the edge parts of the thin wall part 23.

As described, in accordance with the deformation characteristics of the thin wall part 23 of the base member 19, the PZT film 43 is formed in a manner that the film thickness of the PZT film 43 is gradually reduced as the distance to the nearest edge part is decreased. By doing this, the deformation amount in the center part of the PZT film 43, which corresponds to the center part of the thin wall part 23 of the base member 19 which is more likely to be deformed, becomes greater, and the deformation amount in the edge parts of the PZT film 43, which corresponds to the edge parts of the thin wall part 23 of the base member 19 which is less likely to be deformed, becomes smaller.

By doing this, it becomes possible to effectively deform the thin wall part 23 of the base member 19. Further, by satisfying the relationship Wp≥Wi, it becomes possible for the PZT film 43 to reliably face the thin wall part 23 of the base member 19. Accordingly, it becomes possible to reliably and effectively deform the thin wall part 23 of the base member 19. Here, if the "Wp" is significantly greater than the "Wi", the deformation amount of the PZT film 43 may be decreased. In this regard, it is preferable that the "Wp" is less than 1.1 times greater than the "Wi".

As described above, according to this embodiment, it becomes possible to effectively deform the thin wall part 23 of the base member 19. Accordingly, it becomes possible to improve the drive efficiency of the piezoelectric actuator.

Figure 8:
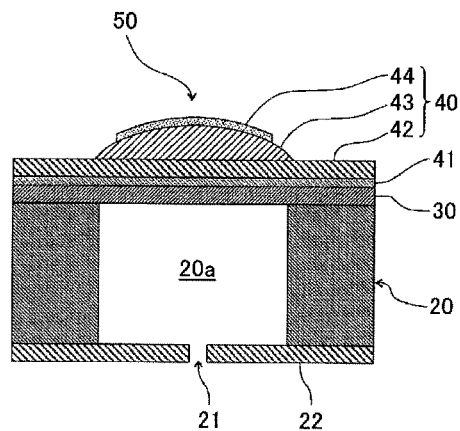
FIG. 8 schematically illustrates an example configuration of the liquid droplet ejecting head using the electro-mechanical transducer element (PZT element) manufactured based on the manufacturing method according to an embodiment.

FIG. 8 schematically illustrates an example configuration of a liquid droplet ejecting head 50 using the electro-mechanical transducer element (PZT element) 40 which is manufactured based on the manufacturing method described above. In the example of FIG. 8, the vibration plate 30, the adhesion layer 41, and the lower electrode (first electrode) 42 are laminated on the silicon substrate 20 which becomes a chamber substrate on which a liquid chamber (pressure chamber) 20a is formed.

Further, on a predetermined part on the lower electrode (first electrode) 42, it is possible to form the patterned PZT film 43 and upper electrode 44 having the equivalent performance of bulk ceramics and formed by an easy method described above. After that, the liquid chamber 20a is formed by an etching removal process etching from the rear surface side of the silicon substrate 20 (i.e., the lower side of the figure). Then, a nozzle plate 22 in which a nozzle hole 21 is formed is attached (bonded) to the silicon substrate 20, so as to form the liquid droplet ejecting head 50.

Figure 9:
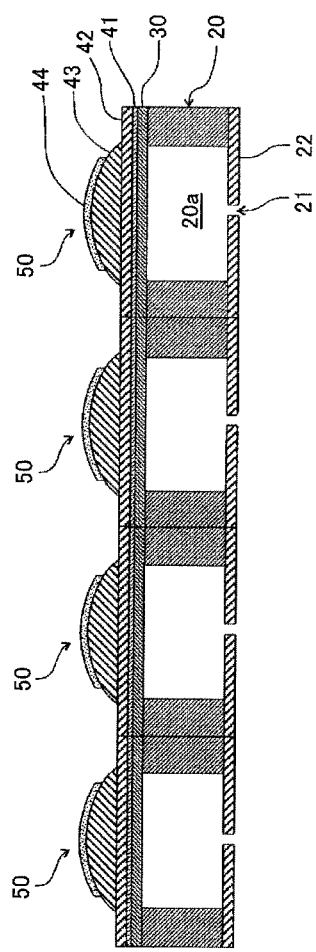
FIG. 9 schematically illustrates an example configuration including a plurality of the liquid droplet ejecting heads of FIG. 8.

In FIG. 8, the descriptions of the liquid supply means, a flow path, and a fluid resistance are omitted. Further, as shown in FIG. 9, it is possible to arrange a plural number of the liquid droplet ejecting heads 50.

Further, the liquid droplet ejecting head including the electro-mechanical transducer element (PZT element) manufactured by the method described above may be used, for example, as the inkjet head of an image forming apparatus.

Further, the liquid droplet ejecting head including the electro-mechanical transducer element (PZT element) manufactured by the method described above may be used in applications including, but not limited to, a micro pump, an ultrasonic motor, an acceleration sensor, a dual-axis scanner for a projector, and an infusion pump.

Figure 10:
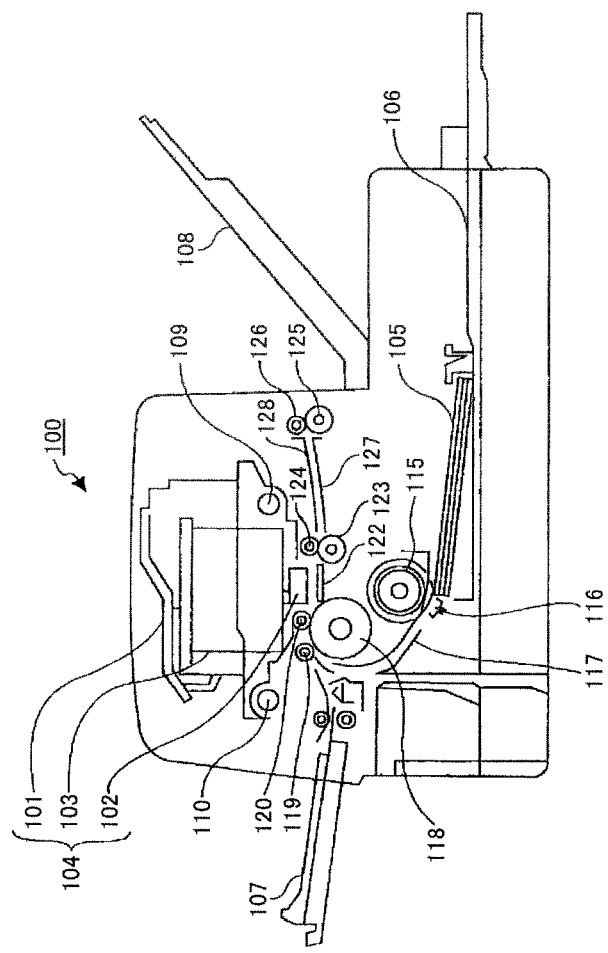
FIG. 10 schematically illustrates an example configuration of a liquid droplet ejecting apparatus including the electro-mechanical transducer element manufactured based on the manufacturing method according to an embodiment.
Figure 11:
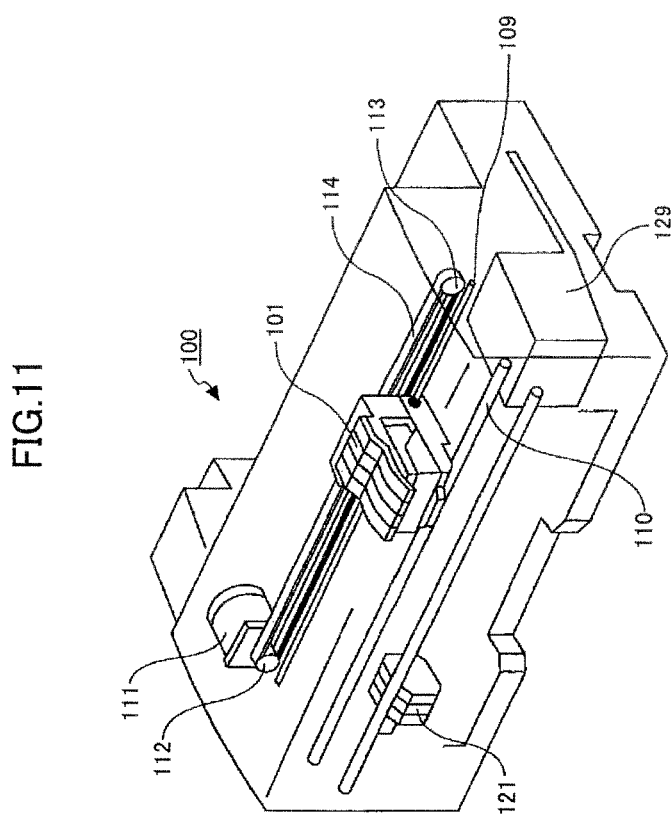
FIG. 11 is a schematic perspective view of the liquid droplet ejecting apparatus.

FIG. 10 schematically illustrates an example configuration of a liquid droplet ejecting apparatus that can use the electro-mechanical transducer element manufactured (formed) based on the manufacturing method described above. FIG. 11 is a schematic perspective view of the liquid droplet ejecting apparatus. In those figures, it is assumed that the liquid droplet ejecting apparatus includes a liquid droplet ejecting head (s) having the electro-mechanical transducer element which is manufactured (formed) based on the method of manufacturing the electro-mechanical transducer element according to an embodiment of the present invention as described above.

As shown in FIG. 10, an inkjet recording apparatus 100 as an example of the liquid droplet ejecting apparatus according to an embodiment of the present invention includes a carriage 101 that can be movable in a main scanning direction in the recording apparatus main body. The inkjet recording apparatus 100 further includes a recording head 102 mounted on the carriage 101, the recording head 102 including an inkjet head which is an example of the liquid droplet ejecting head that is manufactured by carrying out the present invention.

The inkjet recording apparatus 100 further includes a print mechanism part 104 having an ink cartridge(s) 103 which serve as liquid cartridge(s) supplying color ink, as a liquid for the recording head 102, to the recording head 102. Further, a sheet feed cassette 106 can be detachably mounted in a lower part of the apparatus main body, in a manner that many sheets 105 can be stacked in the sheet feed cassette 106. Further, a manual tray 107 for manually providing (feeding) the sheets 105 can be open from the apparatus main body.

The sheet 105 is fed from the sheet feed cassette 106 or the manual tray 107 to the print mechanism part 104, so that a desired image is printed on the sheet 105. Then, the sheet 105 is further fed to a sheet discharge tray 108 which is mounted on the rear surface side of the apparatus main body. The print mechanism part 104 includes a main guide rod 109 and a sub guide rod 110 which are bridged between left and right side walls (not shown), so that the main guide rod 109 and the sub guide rod 110 slidably support the carriage 101 in the main scanning direction.

The carriage 101 includes the recording head 102 that includes the inkjet head which is an example of the liquid droplet ejecting head that ejects yellow (Y), cyan (C), magenta (M), and black (Bk) ink droplets. In the recording head 102, there is a plurality of ink ejecting outlets (i.e., nozzles) that are arranged in the direction crossing the main scanning direction in a manner that the ink ejecting direction thereof is directed downward. Further, in the carriage 101, the ink cartridges 103 for supplying respective color ink to the recording head 102 are exchangeably provided.

The ink cartridge 103 include an air opening, which is in communication with outside air, formed in an upper part of the ink cartridges 103 and a supply outlet, which is for supplying ink to the recording head 102, formed in a lower part of the ink cartridges 103. Further, in the ink cartridge 103, a porous body in which ink is filled is provided. Due to capillary force of the porous body, a negative pressure is maintained in the ink to be supplied to the recording head 102. In this example, a case is described where the recording heads 102 supply the respective color ink.

However, obviously, it is possible to use a single recording head 102 that can eject, for example, ink in those colors. Here, for example, the carriage 101 is slidably attached around the main guide rod 109 which is provided on the rear side (i.e., on the downstream side in the sheet feed direction) of the carriage 101 and is slidably mounted on the sub guide rod 110 on the front side (i.e., on the upstream side in the sheet feed direction) of the carriage 101.

Further, in order to move and scan the carriage 101 in the main scanning direction, there is provided a timing belt 114 which is stretched between a drive pulley 112 and a driven pulley 113, the drive pulley 112 being rotatably driven by a main-scanning motor 111. The timing belt 114 is attached to the carriage 101, so that the carriage 101 is driven back and forth by the forward-reversal rotation of the main-scanning motor 111.

On the other hand, to feed the sheets 105, which is set in the sheet feed cassette 106, to the lower side of the recording head 102, the following members are provided. First, there are provided a sheet feed roller 115 and a friction pad 116 to separate and feed a sheet 105 from the sheet feed cassette 106 and a guide member 117 to guide the sheet 105. Further, there are provided a feed roller 118, a feed roller 119, and a head roller 120. Here, the feed roller 118 inverts and feeds the sheet 105. The feed roller 119 is pressed to the circumferential surface of the feed roller 118. The head roller 120 determines the feeding angle of the sheet 105 fed from the feed roller 118.

The feed roller 118 is rotatably driven by a sub-scanning motor 121 via a gear train. Further, there is provided an imaging receiving member 122 which is a sheet guide member to guide the sheet 105, which is fed from the feed roller 118, under the recording head 102 in a range corresponding to the moving range of the carriage 101 in the main scanning direction. On the downstream side of the imaging receiving member 122, there are provided a feed roller 123 and a spur roller 124 facing the feed roller 123.

The feed roller 123 is rotatably driven to feed the sheet 105 in the sheet discharge direction. On the downstream side of the feed roller 123 and the spur roller 124, there are provided a feed roller 125 and a spur roller 126 to further feed the sheet 105 to the sheet discharge tray 108 and guide members 127 and 128 to form (provide) a sheet discharge path for the sheet 105. In recording (printing), the recording head 102 is driven in accordance to an image signal while moving the carriage 101, so that a single line of the image is recorded by ejected ink onto the sheet 105 which is stopped and then the sheet 105 is moved by a predetermined amount (distance) for recording the image of the next line.

Upon receiving a record end signal or a signal indicating the rear end of the sheet 105 reaches the recording (printing) area, the recording operation is stopped and the sheet 105 is discharged. Further, a recovery apparatus 129 to recover the ejection failure of the recording head 102 is provided in an area outside of the recording area, the area being on the right end side in the moving direction of the carriage 101.

The recovery apparatus 129 includes a capping means, a suction means, and a cleaning means. During the print waiting period, the carriage 101 is moved to the recovery apparatus 129, so that the recording head 102 is capped by the capping means. By doing this, the ejection outlets can be kept in a moistened condition so as to prevent an ejection failure due to ink drying.

Further, during recording, by ejecting ink which does not contribute to the recording, the ink viscosity of the ink at all the ejection outputs is kept constant to maintain the ejecting performance in a stable condition.

In the above description, an image forming apparatus is described where an image is formed by landing liquid droplets ejected from the liquid droplet ejecting head. However, it should be understood that the present invention may also be applied to a liquid droplet ejecting apparatus other than an image forming apparatus.

For example, the present invention may also be applied to a case where the medium on which the liquid droplets are landed refers to a medium, which is other than a sheet, such as a recording medium, a transfer material, a recording sheet, etc., thread, fiber, cloth, leather, metal, plastic, glass, wood, ceramics, etc. Further, the present invention may be applied not only to an apparatus in which a meaningful image such as characters and figures is formed on a medium but also an apparatus in which a meaningless image such as characters are formed on a medium (e.g., liquid droplets are merely ejected).

Further, the present invention may also be applied to an apparatus in which a liquid resist for patterning is ejected to be landed on a medium. Further, present invention may also be applied to, for example, a liquid droplet ejecting apparatus in which a gene analysis sample is ejected to be landed on a medium and a liquid droplet ejecting apparatus for a three-dimensional molding.

It should be noted that what is described in the above description is only an example according to an embodiment of the present invention. The present invention may also be applied in, for example, the following embodiments and provide at least a specific effect according to an embodiment of the present invention.

Embodiment A

An actuator includes the base member 19 and the electro-mechanical transducer film 40 formed on a one side surface side of the base member 19. The base member 19 includes the plate-like silicon substrate 20 and the vibration plate 30. The electro-mechanical transducer film 40 includes the first electrode such as the lower electrode 42, the electro-mechanical transducer film such as the PZT film 43, and the second electrode such as the upper electrode 44.

The base member 19 includes the thin wall part 23 which is formed in a concave shape on the side opposite to the one side surface side where the electro-mechanical transducer film 40 is formed. The electro-mechanical transducer film is formed in a manner that the film thickness of the electro-mechanical transducer film is gradually reduced from the center part of the electro-mechanical transducer film to each of the both end parts of the of the electro-mechanical transducer film, the both end parts being disposed in at least one direction crossing the film thickness direction of the electro-mechanical transducer film.

When the symbol "Wp" denotes the width in the film thickness change direction, which crosses the film thickness direction of the electro-mechanical transducer film, where the film thickness changes and the symbol "Wi" denotes the width of the thin wall part 23 of the base member 19 in the film thickness change direction of the electro-mechanical transducer film, the relationship Wp≥Wi is satisfied.

According to this embodiment A, as described in the above embodiment, the center part of the thin wall part 23 of the base member 19 is less influenced by the thick parts around the thin wall part 23, so that the center part of the thin wall part 23 is more likely to be deformed.

On the other hand, the closer the part of the thin wall part 23 becomes to each of the both end parts in at least one direction crossing the film thickness direction of the electro-mechanical transducer film, the more the part of the thin wall part 23 is likely to be influenced by the thick parts around the thin wall part 23, so that the part of the thin wall part 23 is less and less likely to be deformed.

Namely, the thin wall part 23 of the base member 19 has deform characteristics such that the enter part is more likely to be deformed and it becomes gradually difficult for a part of the thin wall part 23 to be deformed as the part of the thin wall part 23 approaches each of the both end parts of the thin wall part 23. The electro-mechanical transducer film is formed so as to have a shape in which the film thickness of the electro-mechanical transducer film is gradually reduced from the center part to each of the both end parts of the electro-mechanical transducer film, so that the deformed amount of the electro-mechanical transducer film which is deformed with the thin wall part 23 is gradually reduced from the center part to each of the both end parts of the electro-mechanical transducer film when a voltage is applied to the electro-mechanical transducer film.

By doing it in this way, the center part of the thin wall part 23 of the base member 19 which is more likely to be deformed can be deformed by the center part of the electro-mechanical transducer film which is more deformed when a voltage is applied thereto. Therefore, it becomes possible to greatly deform the center part of the thin wall part 23. On the other hand, the both end parts of the thin wall part 23 of the base member 19 which is less likely to be deformed are deformed by the both end parts of the electro-mechanical transducer film which is less deformed when a voltage is applied thereto.

Therefore, it becomes possible to reduce the deformed amount of the both end parts of the thin wall part 23 accordingly. As a result, it becomes possible to control (reduce) a wasteful drive of the electro-mechanical transducer film to the thin wall part 23 of the base member 19. As described above, while a wasteful drive can be controlled at the both end parts of the thin wall part 23 of the base member 19 which are less likely to be deformed, the center part of the thin wall part 23 which is more likely to be deformed can be deformed. Therefore, it becomes possible to effectively deform the thin wall part 23 of the base member 19.

Further, by fulfilling the relationship Wp Wi, it becomes possible for the electro-mechanical transducer film to correspond to the entire thin wall part 23 of the base member 19. Therefore, it becomes possible to reliably and effectively deform the entire thin wall part 23 of the base member 19.

As described above, since the thin wall part 23 of the base member 19 can be effectively deformed, it becomes possible to improve the drive efficiency of the actuator.

Embodiment B

In Embodiment A, the base member 19 includes a substrate such as the silicon substrate 20 and the vibration plate 30 which is disposed between the substrate and the electro-mechanical transducer element 40. The thin wall part 23 is formed (defined) by the through hole 20$h$ and the vibration plate 30. By doing this, as described in the above embodiment, it becomes easier to form the wall part 23 having a predetermined thickness due to the vibration plate 30.

Embodiment C

In Embodiment A or B, the film thickness distribution shape in at least one cross section of the electro-mechanical transducer film is approximated by the formula 1: $y=-ax^2+b$, where the symbol "x" denotes the coordinate position in the direction orthogonal to the film thickness direction and the value of "x" at the center of the cross section of the electro-mechanical transducer film is set to zero (i.e., x=0), and the symbol "y" denotes the film thickness of the electro-mechanical transducer film at the position of "x".

According to this, as described in the above embodiment, the electro-mechanical transducer film has the film thickness distribution shape that can be approximated by a quadratic function of formula 1. Therefore, it becomes possible for an actuator having an electro-mechanical transducer film to obtain vibration and deformed displacement having improved efficiency.

Embodiment D

In Embodiment C, the coefficient "a" in formula 1 satisfies the relationship: $0.8\times\{(2Tm)/W^2\}<a<1.2\times\{(2Tm)/W^2\}$, where the symbol "Tm" denotes the film thickness of the electro-mechanical transducer film at the center part of the cross section, and the symbol "W" denotes the width in the X-axis direction of the electro-mechanical transducer film.

By having the relationship, as described in the above embodiment, the actuator including the electro-mechanical transducer film fulfilling the relationship in the Embodiment D may acquire vibration and deformed displacement having further improved efficiency.

Embodiment E

In Embodiment C or D, the constant "b" in formula 1 satisfies the relationship: 0.8Tm<b<1.2Tm, where the symbol "Tm" denotes the film thickness of the electro-mechanical transducer film at the center part of the cross section.

By doing this, as described in the above embodiment, the actuator including the electro-mechanical transducer film fulfilling the relationship in Embodiment E may acquire vibration and deformed displacement having further improved efficiency.

Embodiment F

A method of manufacturing an actuator including an electro-mechanical transducer film such as the PZT film 43, the method includes a step of forming the first electrode such as the lower electrode on (above) one surface of the base member 19 including a plate-like silicon substrate 20 and the vibration plate 30, an application step of applying an application liquid such as a precursor sol-gel liquid on the first electrode, and a drying step of drying the film of the applied application liquid. Further, in this method, the film forming step including the application step and the drying step is repeated.

Further, in this method, in the film forming step, the electro-mechanical transducer film is formed in a manner that the film thickness of the electro-mechanical transducer film is gradually reduced as the distance to an edge part of the electro-mechanical transducer film is reduced.

The method further includes a thin wall part forming step of forming the thin wall part 23 of the base member 19 in a manner that the thin wall part 23 is formed so as to have a concave shape on the side opposite to the side of the one surface side of the base member 19 and so as to face the first electrode.

Further, in the actuator manufactured in this method, when the symbol "Wp" denotes the width in the film thickness change direction, which crosses the film thickness direction of the electro-mechanical transducer film, where the film thickness changes and the symbol "Wi" denotes the width of the thin wall part 23 of the base member 19 in the film thickness change direction of the electro-mechanical transducer film, the relationship Wp≥Wi is satisfied.

By using this method, it becomes possible to effectively deform the thin wall part 23 of the base member 19. Further, by fulfilling the relationship Wp≥Wi, it becomes possible for the electro-mechanical transducer film to correspond to the entire thin wall part 23 of the base member 19. Therefore, it becomes possible to reliably and effectively deform the entire thin wall part 23 of the base member 19.

As described above, since the thin wall part 23 of the base member 19 can be effectively deformed, it becomes possible to improve the drive efficiency of the actuator.

Embodiment G

In Embodiment F, the base member 19 includes a substrate such as the silicon substrate 20 and the vibration plate 30 which is disposed between the substrate and the first electrode. The thin wall part 23 is formed (defined) by the through hole 20h and the vibration plate 30.

By doing this, as described in the above embodiment, it becomes easier to form the wall part 23 having a further constant predetermined thickness due to the vibration plate 30.

Embodiment H

In Embodiment F or G, in the application step, liquid droplets of the application liquid are applied using an inkjet method using the electro-mechanical transducer element to which a pulse voltage is applied.

By doing this, as describe in the above embodiment, it becomes possible to control the application position of the application liquid and the allocation amount so as to accurately form the electro-mechanical transducer film in a manner that the film thickness of the electro-mechanical transducer film is gradually reduced from the enter part to an end (circumference) part of the electro-mechanical transducer film.

Embodiment I

In Embodiment F or H, the application liquid is sol-gel liquid. Further, the film forming step includes a thermal decomposition step of thermally decomposing the dried film of the application liquid. By doing this, as described in the above embodiment, it becomes possible to form the film having a predetermined film thickness of the film when the film is formed by applying sol-gel liquid and thermally decomposing the film.

Embodiment J

In Embodiment I, the method further includes the crystallization step of crystallizing the thermally decomposed film. Further, in this method, the film forming step and the crystallization step are repeated one or more cycles.

By doing this, as described in the above embodiment, it becomes possible to form the film having a predetermined film thickness of the film when the film is finally formed by crystallizing the thermally decomposed film.

Embodiment K

In Embodiment I or J, the method further includes a surface modification step of partially modifying the surface for the first electrode. In this case, the surface modification step is done before the application step of the film forming step. By doing this, as described in the above embodiment, it becomes possible to improve the pattern accuracy of the electro-mechanical transducer film.

Embodiment L

In Embodiment K, in the surface modification step, a thiol compound is formed on the first electrode, and the formed thiol compound is partially removed by a photolithography etching process. By doing this, as described in the above embodiment, it becomes possible to improve the pattern accuracy of the electro-mechanical transducer film.

Embodiment M

In one of Embodiments F through L, the film thickness distribution shape in at least one cross section of the electro-mechanical transducer film is approximated by the formula 1: $y=-ax^2+b$, where the symbol "x" denotes the coordinate position in the direction orthogonal to the film thickness direction and the value of "x" at the center of the cross section of the electro-mechanical transducer film is set to zero (i.e., x=0), and the symbol "y" denotes the film thickness of the electro-mechanical transducer film at the position of "x".

According to this method, as described in the above embodiment, the electro-mechanical transducer film has the film thickness distribution shape that can be approximated by a quadratic function of formula 1. Therefore, it becomes possible for an actuator having an electro-mechanical transducer film to obtain vibration and deformed displacement having improved efficiency.

Embodiment N

In Embodiment M, the coefficient "a" in formula 1 satisfies the relationship: $0.8\times\{(2Tm)/W^2\}<a<1.2\times\{(2Tm)/W^2\}$, where the symbol "Tm" denotes the film thickness of the electro-mechanical transducer film at the center part of the cross section, and the symbol "W" denotes the width in the X-axis direction of the electro-mechanical transducer film.

By having the relationship, as described in the above embodiment, the actuator including the electro-mechanical transducer film fulfilling the relationship in Embodiment N may acquire vibration and deformed displacement having further improved efficiency.

Embodiment O

In embodiment M or N, the constant "b" in formula 1 satisfies the relationship: $0.8Tm<b<1.2Tm$, where the symbol "Tm" denotes the film thickness of the electro-mechanical transducer film at the center part of the cross section. By doing this, as described in the above embodiment, the actuator including the electro-mechanical transducer film fulfilling the relationship in Embodiment E may acquire vibration and deformed displacement having further improved efficiency.

Embodiment P

A liquid droplet ejecting head 50 includes a nozzle 21 ejecting liquid droplets such as ink droplets, a compression chamber such as a liquid chamber 20a which is in communication with the nozzle 21, and a pressure generation means to generate a pressure to the liquid in the compression chamber. The pressure generation means is an actuator manufactured by the method of manufacturing the actuator according to any one of the Embodiments F through O.

By doing this, as described in the above embodiment, it becomes possible to provide a liquid droplet ejecting head having stable ejecting characteristics of the liquid droplets ejected from a plurality of actuators.

Embodiment Q

A liquid droplet ejecting apparatus including the liquid droplet ejecting head according to Embodiment P. By doing this, as described in the above embodiment, it becomes possible to provide a liquid droplet ejecting head having stable ejecting characteristics of the liquid droplets ejected from a plurality of actuators.

Embodiment R

An image forming apparatus such as an inkjet recording apparatus 100 forming an image on a recording medium by ejecting liquid droplets from the liquid droplet ejecting head for forming the image includes the liquid droplet ejecting head in Embodiment P as the liquid droplet ejecting head thereof.

By doing this, as described in the above embodiment, it becomes possible to provide a liquid droplet ejecting head having a stable ejecting characteristics of the liquid droplets ejected from a plurality of actuators.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An actuator comprising:
a base member having a plate shape; and
an electro-mechanical transducer element formed on one surface side of the base member and including a first electrode, an electro-mechanical transducer film, and a second electrode,
wherein the base member includes a thin wall part formed on a side opposite to the one surface side where the electro-mechanical transducer element is formed and having a concave shape,
wherein the electro-mechanical transducer film is formed in a manner such that a film thickness of the electro-mechanical transducer film is gradually reduced from a center part of the electro-mechanical transducer film to both end parts of the electro-mechanical transducer film in at least one direction crossing a film thickness direction of the electro-mechanical transducer film, and
wherein when "Wp" denotes a width in the at least one direction which crosses the film thickness direction of the electro-mechanical transducer film and where the film thickness of the electro-mechanical transducer film changes and "Wi" denotes a width of the thin wall part of the base member in the at least one direction where the film thickness of the electro-mechanical transducer film changes, a relationship Wp≥Wi is satisfied,
wherein a film thickness distribution shape of the electro-mechanical transducer film is approximated by the following formula (1) in at least one cross section of the electro-mechanical transducer film:

$$y=-ax^2+b \qquad (1)$$

where the symbol "x" denotes a coordinate position in a direction orthogonal to the film thickness direction and a value of "x" at a center of the at least one cross section of the electro-mechanical transducer film is set to zero (i.e., x=0), and the symbol "y" denotes the film thickness of the electro-mechanical transducer film at the position of "x", and
the coefficient "a" in formula (1) satisfies the following relationship:

$$0.8\times\{(2Tm)/W^2\}<a<1.2\times\{(2Tm)/W^2\},$$

where the symbol "Tm" denotes the film thickness of the electro-mechanical transducer film at a center part of the at least one cross section, and the symbol "W" denotes a width in the X-axis direction of the electro-mechanical transducer film, and
the constant "b" in formula (1) satisfies the following relationship:

$$0.8Tm<b<1.2Tm,$$

where the symbol "Tm" denotes the film thickness of the electro-mechanical transducer film at a center part of the at least one cross section.

2. The actuator according to claim 1,
wherein the base member includes a substrate and a vibration plate disposed between the substrate and the electro-mechanical transducer element, and
wherein the thin wall part of the base member is formed by a through hole formed in the substrate and the vibration plate.

3. A liquid droplet ejecting head comprising:
a nozzle configured to eject liquid droplets;
a compression chamber in communication with the nozzle; and
a pressure generation unit configured to generate a pressure to the liquid in the compression chamber,
wherein the pressure generation unit is an actuator according to claim 1.

4. A liquid droplet ejecting apparatus comprising the liquid droplet ejecting head according to claim 3.

5. An image forming apparatus forming an image on a recording medium by ejecting liquid droplets from a liquid droplet ejecting head according to claim 3.

6. A liquid droplet ejecting head comprising:
a nozzle configured to eject liquid droplets;
a compression chamber in communication with the nozzle; and
a pressure generation unit configured to generate a pressure to the liquid in the compression chamber,
wherein the pressure generation unit includes the actuator according to claim 1.

* * * * *